(12) United States Patent
Hanaoka

(10) Patent No.: US 7,009,306 B2
(45) Date of Patent: Mar. 7, 2006

(54) SEMICONDUCTOR DEVICE AND METHOD OF MANUFACTURING THE SAME, CIRCUIT BOARD, TOGETHER WITH ELECTRONIC INSTRUMENT

(75) Inventor: Terunao Hanaoka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/853,252

(22) Filed: May 26, 2004

(65) Prior Publication Data

US 2005/0006753 A1   Jan. 13, 2005

(30) Foreign Application Priority Data

Jun. 27, 2003   (JP) ............................. 2003-184568

(51) Int. Cl.
*H01L 23/48* (2006.01)
*H01L 21/44* (2006.01)

(52) U.S. Cl. ...................... 257/781; 257/784; 257/786; 438/612; 438/614

(58) Field of Classification Search ................ 257/781, 257/784; 438/612, 614, 611, 622
See application file for complete search history.

(56) References Cited

U.S. PATENT DOCUMENTS 5,525,546 A * 6/1996 Harada et al. .............. 438/612
5,793,117 A * 8/1998 Shimada et al. ............ 257/780
5,925,931 A * 7/1999 Yamamoto .................. 257/737
6,707,153 B1   3/2004 Kuwabara et al.
2003/0141603 A1 * 7/2003 Hashimoto .................. 257/781

FOREIGN PATENT DOCUMENTS

JP   2003-023009   1/2003

OTHER PUBLICATIONS

U.S. Appl. No. 09/700,464, filed Nov. 15, 2000, Terunao Hanaoka et al.

* cited by examiner

Primary Examiner—Jasmine Clark
(74) Attorney, Agent, or Firm—Oliff & Berridge, PLC (57) ABSTRACT

The semiconductor device includes a semiconductor substrate in which is formed an integrated circuit, the semiconductor substrate having electrodes; a first resin section formed in a central portion of a surface of the semiconductor substrate on which the electrodes are formed; a plurality of second resin sections formed on the surface of the semiconductor substrate on which the electrodes are formed, in a region closer to an edge portion of the semiconductor substrate than the first resin section; an interconnect formed over the first resin section and one of the electrodes; and a resin layer formed to cover the interconnect and extend from the first resin section to outer sides of the second resin sections.

20 Claims, 5 Drawing Sheets

SEMICONDUCTOR DEVICE AND METHOD OF MANUFACTURING THE SAME, CIRCUIT BOARD, TOGETHER WITH ELECTRONIC INSTRUMENT

Japanese Patent Application No. 2003-184568, filed on Jun. 27, 2003, is hereby incorporated by reference in its entirety.

BACKGROUND OF THE INVENTION

The present invention relates to a semiconductor device and a method of manufacturing the same, a circuit board, together with an electronic instrument The usage of chip scale/size packaging (CSP) is becoming more popular, as packaging of semiconductor devices. A technique of fabricating packaging at the wafer level (wafer-level packaging) has been developed. Since a package fabricated by this method (such as a wafer-level CSP) has the same external dimensions as the semiconductor chip therein, it differs from the configurations of prior-art packages but it is required to have at least the same level of reliability as a prior-art package, if not higher.

BRIEF SUMMARY OF THE INVENTION

A semiconductor device according to one aspect of the present invention includes:

a semiconductor substrate in which is formed an integrated circuit, the semiconductor substrate having electrodes;

a first resin section formed in a central portion of a surface of the semiconductor substrate on which the electrodes are formed;

a plurality of second resin sections formed on the surface of the semiconductor substrate on which the electrodes are formed, in a region closer to an edge portion of the semiconductor substrate than the first resin section;

an interconnect formed over the first resin section and one of the electrodes; and a resin layer formed to cover the interconnect and extend from the first resin section to outer sides of the second resin sections.

A circuit board according to another aspect of the present invention has the above semiconductor device mounted thereon.

An electronic instrument according to a further aspect of the present invention has the above semiconductor device.

A method of manufacturing a semiconductor device according to a still further aspect of the present invention includes:

providing a semiconductor substrate in which is formed an integrated circuit, the semiconductor substrate having electrodes;

forming a first resin section in a central portion of a surface of the semiconductor substrate on which the electrodes are formed;

forming a plurality of second resin sections on the surface of the semiconductor substrate on which the electrodes are formed, in a region closer to an edge portion of the semiconductor substrate than the first resin section;

forming an interconnect over the first resin section and one of the electrodes; and forming a resin layer to cover the interconnect and extend from the first resin section to outer sides of the second resin sections.

DETAILED DESCRIPTION OF THE EMBODIMENT

Embodiments of the present invention may provide a highly reliable semiconductor device and a method of manufacturing the same, a circuit board, together with an electronic instrument.

(1) A semiconductor device according to one embodiment of the present invention include:

a semiconductor substrate in which is formed an integrated circuit, the semiconductor substrate having electrodes;

a first resin section formed in a central portion of a surface of the semiconductor substrate on which the electrodes are formed;

a plurality of second resin sections formed on the surface of the semiconductor substrate on which the electrodes are formed, in a region closer to an edge portion of the semiconductor substrate than the first resin section;

an interconnect formed over the first resin section and one of the electrodes; and a resin layer formed to cover the interconnect and extend from the first resin section to outer sides of the second resin sections.

In this embodiment of the present invention, the semiconductor device has second resin sections that are formed in a region of the semiconductor substrate that is closer to the edge than the first resin section. The resin layer is formed to extend as far as the outer side of the second resin sections. This ensures that the forces generated by the contraction of the resin layer are absorbed by the second resin sections. This makes it possible to provide a highly reliable semiconductor device that is not likely to be affected by contraction of the resin layer.

(2) With this semiconductor device, the second resin sections may be formed along all edges of the semiconductor substrate.

(3) With this semiconductor device, the second resin sections may be formed only along two opposite edges of the semiconductor substrate.

(4) With this semiconductor device, the second resin sections may be formed in a region other than regions in which the electrodes are formed.

This makes it possible to provide a semiconductor device having a high level of electrical reliability.

(5) With this semiconductor device, the resin layer may be formed to cover the second resin sections.

(6) With this semiconductor device, the resin layer may be formed to expose at least an upper end portion of at least one of the second resin sections.

(7) With this semiconductor device, at least one of the second resin sections may have a divider portion which is disposed on the semiconductor substrate from a region on the outer sides of the electrodes towards a region on inner sides of the electrodes through a region between two of the electrodes adjacent to each other.

This makes it possible to prevent electromigration between electrodes, enabling the provision of a highly reliable semiconductor device.

(8) A circuit board according to another embodiment of the present invention has the above semiconductor device mounted thereon.

(9) An electronic instrument according to a further embodiment of the present invention has the above semiconductor device.

(10) A method of manufacturing a semiconductor device according to a still further embodiment of the present invention includes:

providing a semiconductor substrate in which is formed an integrated circuit, the semiconductor substrate having electrodes;

forming a first resin section in a central portion of a surface of the semiconductor substrate on which the electrodes are formed;

forming a plurality of second resin sections on the surface of the semiconductor substrate on which the electrodes are formed, in a region closer to an edge portion of the semiconductor substrate than the first resin section;

forming an interconnect over the first resin section and one of the electrodes; and forming a resin layer to cover the interconnect and extend from the first resin section to outer sides of the second resin sections.

This embodiment of the present invention includes forming the second resin sections on the semiconductor substrate in a region closer to an edge portion of the semiconductor substrate than the first resin section. The resin layer is formed to extend as far as the outer sides of the second resin sections. This makes it possible to manufacture a highly reliable semiconductor device in which the forces generated by the contraction of the resin layer are absorbed by the second resin sections.

(11) With this method of manufacturing a semiconductor device, the second resin sections may be formed along all edges of the semiconductor substrate.

(12) With this method of manufacturing a semiconductor device, the second resin sections may be formed only along two opposite edges of the semiconductor substrate.

(13) With this method of manufacturing a semiconductor device, the second resin sections may be formed in a region other than regions in which the electrodes are formed.

This makes it possible to manufacture a semiconductor device having a high level of electrical reliability.

(14) With this method of manufacturing a semiconductor device, the first resin section and the second resin sections may be formed at the same time.

This makes it possible to increase manufacturing efficiency of the semiconductor device.

(15) With this method of manufacturing a semiconductor device, the resin layer may be formed to cover the second resin sections.

(16) With this method of manufacturing a semiconductor device, the resin layer may be formed to expose at least an upper end portion of at least one of the second resin sections.

(17) With this method of manufacturing a semiconductor device, at least one of the second resin sections may have a divider portion which is disposed on the semiconductor substrate from a region on the outer sides of the electrodes towards a region on inner sides of the electrodes through a region between two of the electrodes adjacent to each other.

This makes it possible to prevent electromigration between electrodes, enabling the manufacture of a highly reliable semiconductor device.

Figure 1:
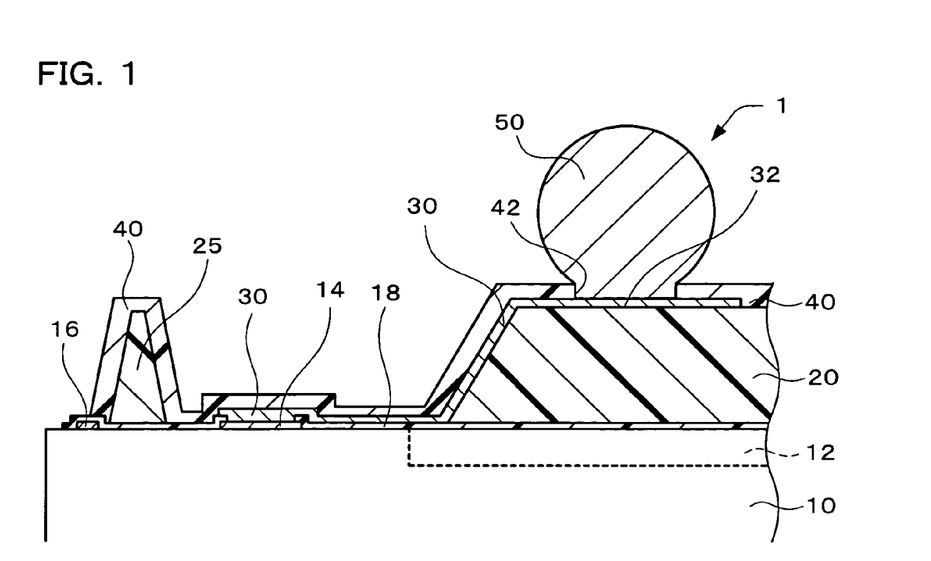
FIG. 1 is illustrative of a semiconductor device in accordance with an embodiment of the present invention.
Figure 2:
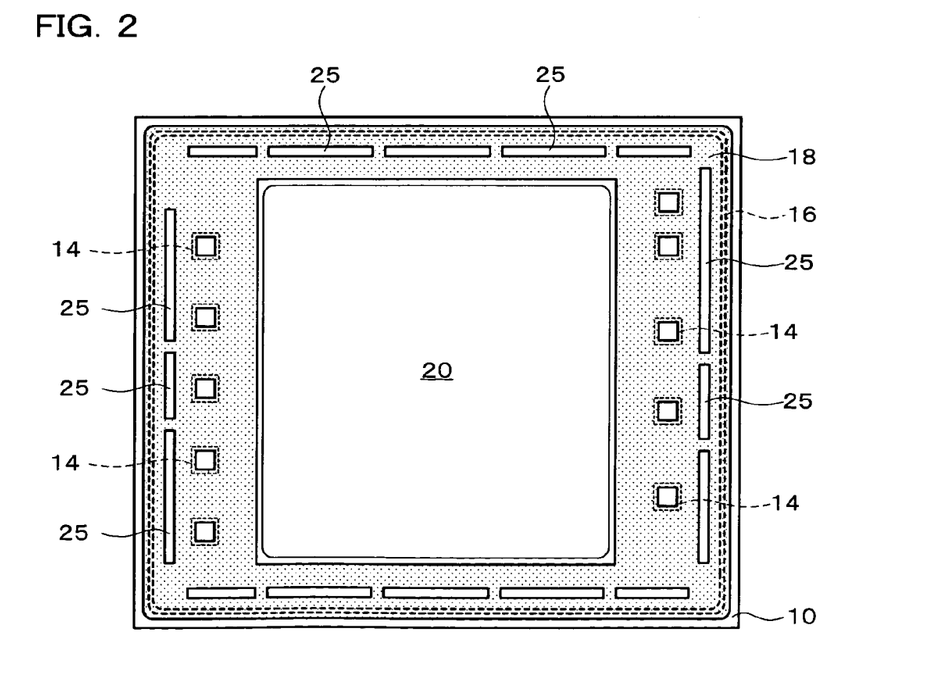
FIG. 2 is further illustrative of the semiconductor device in accordance with an embodiment of the present invention.

An embodiment to which the present invention is applied is described below with reference to the accompanying figures. It should be noted, however, that the present invention is not limited to this embodiment. FIGS. 1 and 2 is illustrative of a semiconductor device in accordance with an embodiment of the present invention. In this case, FIG. 1 is a partial enlargement of a section through a semiconductor device 1 in accordance with this embodiment of the present invention. FIG. 2 is a plan view of the semiconductor device, with an interconnect 30, a resin layer 40, and external terminals 50 omitted to facilitate the description.

The semiconductor device in accordance with this embodiment has a semiconductor substrate 10. The material of the semiconductor substrate 10 is not particularly limited, but it could be silicon, by way of example. The semiconductor substrate 10 could be a semiconductor chip (see FIG. 2). It is usual for the shape in plan view of a semiconductor chip to be rectangular, but it is not limited thereto. However, the semiconductor substrate could also be a semiconductor wafer.

As shown in FIG. 1, one or a plurality of integrated circuits 12 is formed in the semiconductor substrate 10 (one for a semiconductor chip or a plurality for a semiconductor wafer). Each integrated circuit 12 could be formed on one side of the semiconductor substrate 10.

The semiconductor substrate 10 has electrodes 14. Each electrode 14 could be connected electrically to the interior of the semiconductor substrate 10. The electrode 14 could also be connected electrically to the integrated circuit 12. Alternatively, an electrode that is not connected electrically to the integrated circuit 12 could be used as the electrode 14. The electrodes 14 could be arranged along two parallel sides of the semiconductor chip (see FIG. 3) or they could be arranged along four sides thereof. These electrodes 14 could be disposed in the vicinity of edge portions of the semiconductor substrate 10 or they could be disposed in the vicinity of a central portion thereof. Note that a plurality of the electrodes 14 could be formed for a single integrated circuit 12. The material of the electrodes 14 is not particularly limited, but it could be Al, by way of example.

The semiconductor substrate 10 could also have a surrounding member 16. In this case, the surrounding member 16 plays the role of preventing any moisture that intrudes between semiconductor substrate 10 and a passivation film 18 (which will be described later) from reaching as far as an element region of the semiconductor substrate 10. The surrounding member 16 makes it possible to increase the reliability of the semiconductor device. The surrounding member 16 could be formed in a region that is further outward than the electrodes 14, on the surface of the semiconductor substrate 10 on which the electrodes 14 are formed (see FIGS. 1 and 2). The surrounding member 16 could be formed to surround all of the electrodes 14. Specifically, the surrounding member 16 could be formed to surround all of a group of the electrodes 14 formed for one integrated circuit 12 (see FIG. 2). If a semiconductor wafer having a plurality of integrated circuits therein is provided as the semiconductor substrate, the semiconductor substrate could have a plurality of the surrounding members 16, each corresponding to an integrated circuit. It is usual to form the surrounding member 16 integrally. The material of the surrounding member 16 is not particularly limited, but it could be Al, by way of example. The surrounding member 16 could be formed simultaneously with the electrodes 14 in the same processing step, in which case it could be formed of the same material as the electrodes 14.

The semiconductor substrate 10 could also have the passivation film 18. The passivation film 18 is an insulating protective film for protecting the surface of the semiconductor substrate 10 (the surface thereof on which the electrodes 14 are formed). The passivation film 18 could also be formed on the surface of the semiconductor substrate 10 (the surface thereof on which the electrodes 14 are formed). The passivation film 18 could also cover the electrodes 14 and the surrounding member 16 in such a manner that at least part of each electrode 14 is exposed. The passivation film 18 could be formed of SiN, $SiO_2$, or a polyimide resin, by way of example.

This semiconductor device in accordance with this embodiment has a first resin section 20. The first resin section 20 is formed on a central portion of the surface of the semiconductor substrate 10 on which the electrodes 14 are formed. The first resin section 20 could be formed to avoid the electrodes 14. The first resin section 20 could also be formed above the passivation film 18, as shown in FIG. 1. The material of the first resin section 20 is not particularly limited, and thus it could be a polyimide resin, a silicone denatured polyimide resin, an epoxy resin, a silicone denatured epoxy resin, benzocyclobutene (BCB), or polybenzoxazole (PBO).

The semiconductor device in accordance with this embodiment has a plurality of second resin sections 25. The second resin sections 25 are formed on the surface of the semiconductor substrate 10 on which the electrodes 14 are formed, closer to edge portions thereof than the first resin section 20. In other words, the second resin sections 25 are formed in a region further outward than the first resin section 20 of the semiconductor substrate 10. The second resin sections 25 could also be formed in a region that is further outward than the electrodes 14, as shown in FIGS. 1 and 2. The second resin sections 25 could also be formed to avoid the electrodes 14. Specifically, the second resin sections 25 could be formed so as not to touch parts of the electrodes 14 that are exposed from the passivation film 18. This makes it difficult for moisture to penetrate above the electrodes 14, thus making it possible to provide a highly reliable semiconductor device. The second resin sections 25 could also be formed along all the sides of the semiconductor substrate 10, as shown in FIG. 2. The second resin sections 25 could be formed to the same height as the first resin section 20. Note that "height" in this case refers to the height above the surface of the semiconductor substrate 10 (the surface thereof on which the electrodes 14 are formed). The material of the second resin sections 25 is not particularly limited, and thus any of the materials cited in the description of the first resin section 20 could be used therefor. In that case, the first resin section 20 and the second resin sections 25 could be formed of the same materials.

As shown in FIG. 1, the semiconductor device in accordance with this embodiment has the interconnect 30. It is usual to form a plurality of sections of the interconnect 30. The interconnect 30 could be formed of one layer or a plurality of layers. The material of the interconnect 30 is not particularly limited, and it could have a layer formed of Cu, by way of example. The interconnect 30 is formed above the first resin section 20 above the electrodes 14. The interconnect 30 could also be formed to cover all of the portions of the electrodes 14 that are exposed from the passivation film 18. The interconnect 30 is formed to extend from each electrode 14 as far as the upper surface of the first resin section 20 (the surface thereof that is opposite to the passivation film 18). The interconnect 30 could also have a land 32 on top of the first resin section 20. The land 32 is a part of the interconnect 30. In other words, the interconnect 30 comprises the land 32 and a line that electrically connects the land 32 to the electrode 14. The land 32 could be wider than the line of the interconnect 30. The shape of the land 32 in plan view is not particularly limited, and thus it could be circular, by way of example. A plurality of the lands 32 could be formed on the upper surface of the first resin section 20. The interconnect 30 could be formed in such a manner that at least part of the line reaches the upper surface of the first resin section 20.

As shown in FIG. 1, the semiconductor device in accordance with this embodiment has the resin layer 40. The resin layer 40 could also be called solder resist. The resin layer 40 is formed in such a manner that the interconnect 30 is covered thereby. The resin layer 40 is formed to extend from the top of the first resin section 20 to the outer sides of the second resin sections 25. As shown in FIG. 1, the resin layer 40 could be formed to cover the second resin sections 25 as well. The resin layer 40 could be formed within the region in which the passivation film 18 is formed. Alternatively, the resin layer 40 could be formed to extend further outward than the passivation film 18.

The resin layer 40 could also have apertures 42. Each aperture 42 is formed to expose at least part of one of the lands 32. Exposing the land 32 from the aperture 42 makes is possible to ensure electrical contact between an external terminal 50 (which will be described later) and the land 32. The resin layer 40 could be formed to expose the central portion of the land 32 while covering the peripheral portions of the land 32, by way of example.

As shown in FIG. 1, the semiconductor device in accordance with this embodiment could also have external terminals 50. The external terminals 50 are provided on the lands 32. Each external terminal 50 is formed to pass into the interior of the corresponding aperture 42 of the resin layer 40. The portion of the external terminal 50 that is disposed within the aperture 42 could be called a base portion 52. The external terminal 50 is formed of an electrically conductive metal (such as an alloy) that is melted to provide an electrical contact (such as solder). The external terminal 50 could be formed of a soft solder or a hard solder. The external terminal 50 could be formed to have a spherical shape, and it could be a solder ball, by way of example.

Figure 3:
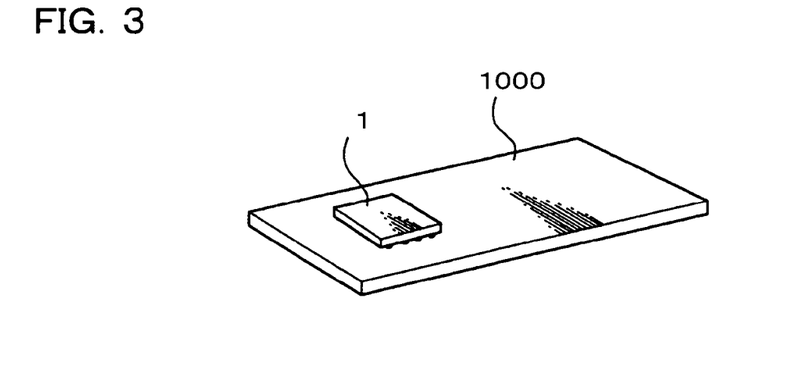
FIG. 3 shows a circuit board on which the semiconductor device in accordance with an embodiment of the present invention is mounted.
Figure 4:
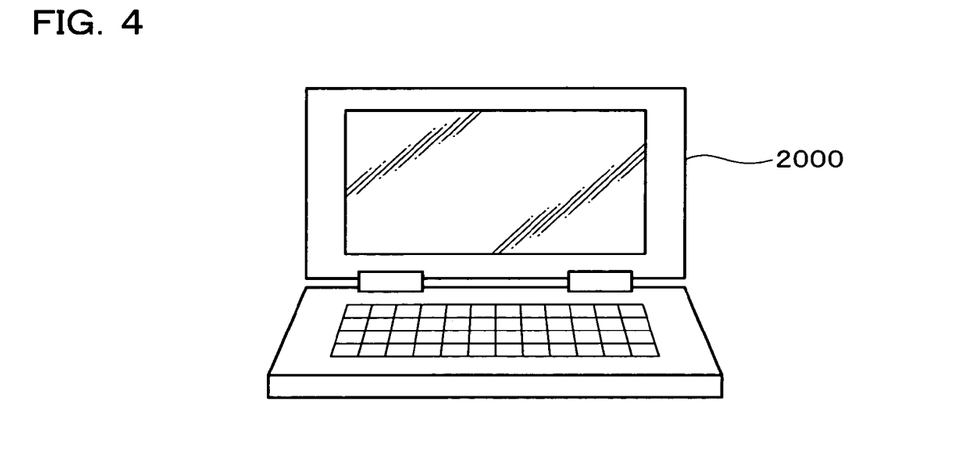
FIG. 4 is illustrative of an electronic instrument having a semiconductor device in accordance with an embodiment of the present invention.
Figure 5:
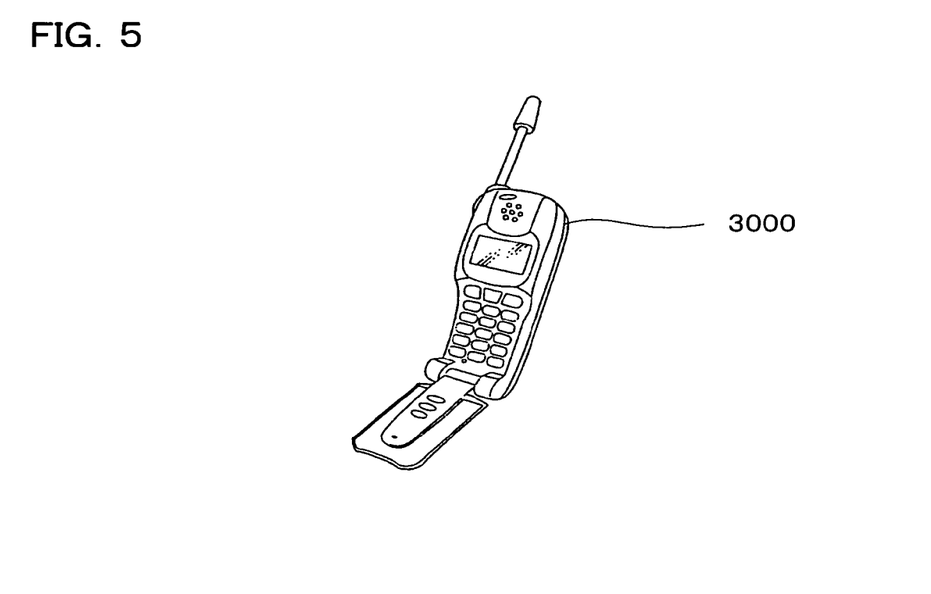
FIG. 5 is illustrative of another electronic instrument having a semiconductor device in accordance with an embodiment of the present invention.

The semiconductor device 1 in accordance with this embodiment of the present invention is configured as described above. Ordinarily, the semiconductor device is subjected to heat during the process of manufacturing the semiconductor device and the process of mounting the semiconductor device on a motherboard or the like. The effects of such processes cause the resin layer (solder resist) to contract, applying forces to the passivation film and the semiconductor substrate. However, the semiconductor device 1 in accordance with this embodiment of the present invention has the second resin sections 25. In addition, the resin layer 40 (solder resist) is formed as far as the outer sides of the second resin sections 25. Thus the stresses generated by the contraction of the resin layer 40 can be absorbed by the second resin sections 25. For that reason, it is possible to provide a highly reliable semiconductor device that is not greatly affected by compression stresses of the resin layer 40. Note that a circuit board 1000 on which the semiconductor device 1 of this embodiment of the present invention is mounted is shown in FIG. 3. A notebook type of personal computer shown in FIG. 4 and a mobile phone shown in FIG. 5 are examples of electronic instruments having the semiconductor device in accordance with this embodiment of the present invention.

The description now turns to the method of manufacturing the semiconductor device 1 in accordance with this embodiment of the present invention. The method of manufacturing the semiconductor device 1 comprises the provision of the semiconductor substrate 10. Any of the previously discussed examples could be used as the semiconductor substrate 10. For example, the semiconductor substrate 10 could be formed to have the electrodes 14 and the integrated circuit 12. The semiconductor substrate 10 could also have the surrounding member 16 and the passivation film 18.

The method of manufacturing the semiconductor device 1 comprises the formation of the first resin section 20 in a central portion of the surface of the semiconductor substrate 10 on which the electrodes 14 have been formed. The method of manufacturing the semiconductor device 1 comprises the formation of the second resin sections 25 in a region of the surface of the semiconductor substrate 10 on which the electrodes 14 have been formed, closer to the edge portions thereof than the first resin section 20. In this case, the first resin section 20 and the second resin sections 25 could be formed by any previously known method. They could be formed in different steps, or together. Forming the first resin section 20 and the second resin sections 25 together would make it possible to increase the efficiency of semiconductor substrate fabrication. The first resin section 20 and the second resin sections 25 could be formed by a process in which a resin layer is formed over the entire surface of the semiconductor substrate 10 (the surface thereof on which the electrodes 14 are formed), and that layer is then exposed and developed, by way of example. By adjusting the mask pattern, the first resin section 20 and the second resin sections 25 could also be formed together. However, the first resin section 20 and the second resin sections 25 could be formed separately therefrom by using a screen-printing method, by way of example.

The method of manufacturing the semiconductor device 1 comprises the formation of the interconnect 30 from above each electrode 14 to above the first resin section 20. The interconnect 30 could be formed by the application of any known method.

The method of manufacturing the semiconductor device 1 comprises the formation of the resin layer 40 that covers the interconnect 30, to extend from above the first resin section 20 to the outer side of the second resin sections 25.

The method of manufacturing the semiconductor device 1 could also comprise the formation of the external terminals 50. The semiconductor device 1 could also be manufactured through a process of forming base reinforcing members (not shown in the figures) or, if the semiconductor substrate was provided as a semiconductor wafer, of cutting the wafer into individual pieces. Note that any items leading from the description of the manufacture of the semiconductor device 1 described above could also be applied as part of the method of manufacturing the semiconductor device.

Modifications

Figure 6:
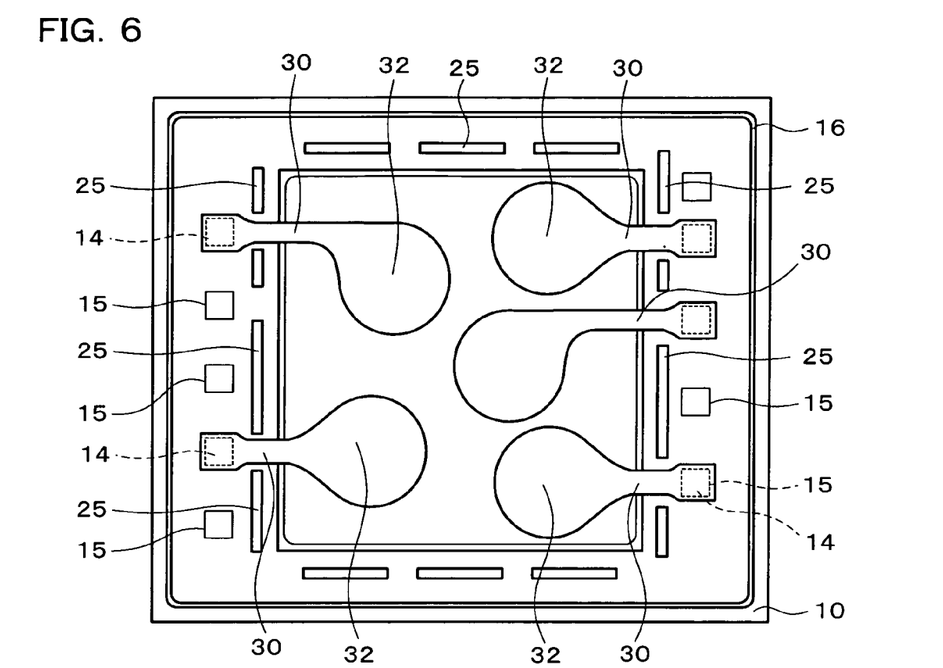
FIG. 6 is illustrative of a modification of the semiconductor device in accordance with an embodiment of the present invention.

In an example shown in FIG. 6, the second resin sections 25 are formed in a region further inward than end portions 15 of the electrodes 14 on the peripheral side of the semiconductor substrate 10. With the semiconductor device in accordance with this embodiment, a resin layer (solder resist) is formed to cover the interconnect 30. For that reason, if the second resin sections 25 are formed in a region further inward than the end portions 15 of the electrodes 14, the formation of the resin layer to cover the interconnect 30 ensures that the resin layer is formed to cover the outer sides of the second resin sections 25. In other words, the exhibit the effects of the present invention can be provided by forming the resin layer in a region that covers the interconnect 30. For that reason, it is possible to reduce the size of the region over which the resin layer is formed, making it possible to form the resin layer at a distance from the edge portions of the semiconductor substrate 10. This makes it possible to ensure that contraction stresses in the resin layer do not affect the edge surfaces of the semiconductor substrate 10, enabling an increase in the reliability of the semiconductor device. It is also possible to prevent the application of stresses to the integrated circuit 12, by forming the second resin sections 25 in positions close to the integrated circuit 12. In particular, if the second resin sections 25 are formed in the vicinity of special elements that configure the integrated circuit 12, those special elements can be protected from stresses, making it possible to provide an even more reliable semiconductor device. Note that the second resin sections 25 could be formed further inward than the electrodes 14, as shown in FIG. 6. In such a case, the second resin sections 25 could be formed to avoid the regions in which the interconnect 30 is formed, as shown in FIG. 6.

Figure 7:
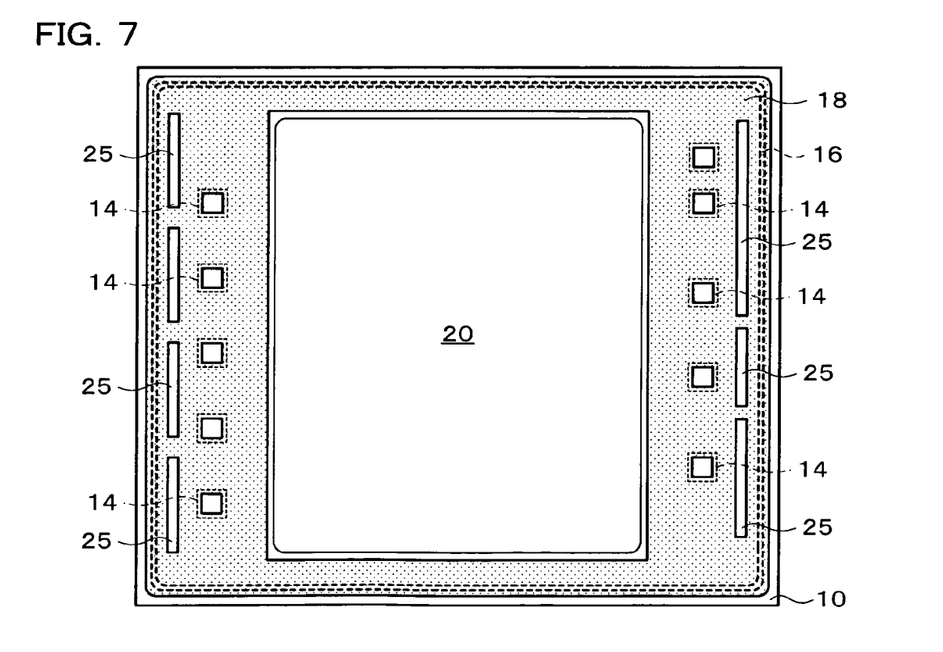
FIG. 7 is illustrative of another modification of the semiconductor device in accordance with an embodiment of the present invention.

In an example shown in FIG. 7, the second resin sections 25 are formed along each of a mutually opposite pair of edges of the semiconductor substrate 10. If the electrodes 14 are formed only along a mutually opposite pair of edges of the semiconductor substrate 10, as shown by way of example in FIG. 7, the second resin sections 25 could be formed only along those edges. This makes it possible to achieve effects similar to those of the above-described embodiments. It should be noted, however, that the second resin sections could also be formed along the edges along which the electrodes 14 are not formed (although this is not shown in the figure).

Figure 8:
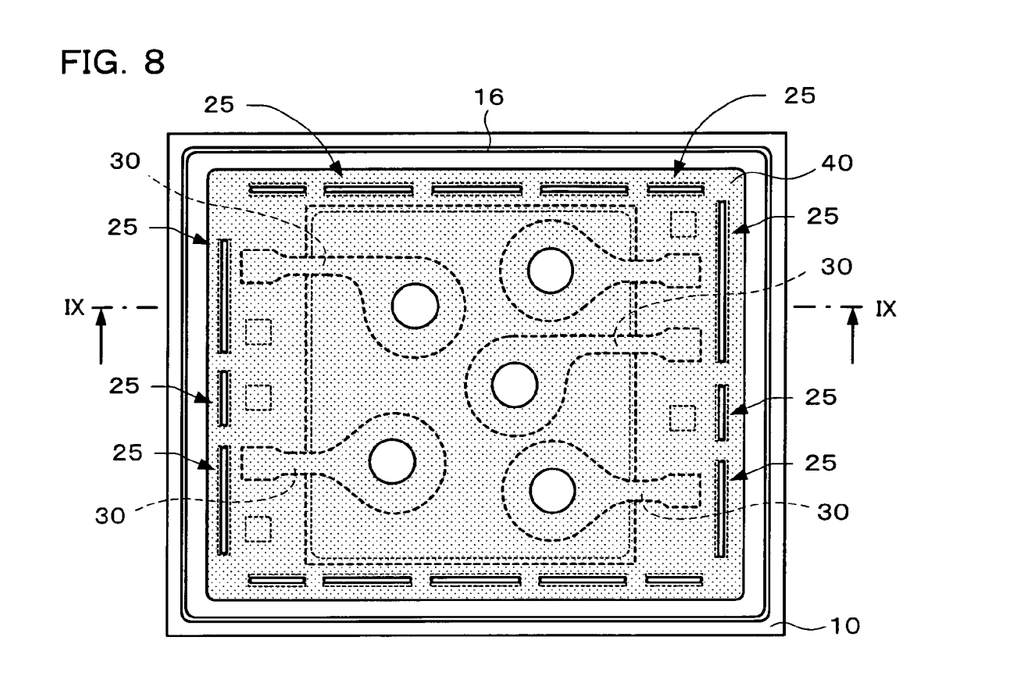
FIG. 8 is illustrative of a further modification of the semiconductor device in accordance with an embodiment of the present invention.
Figure 9:
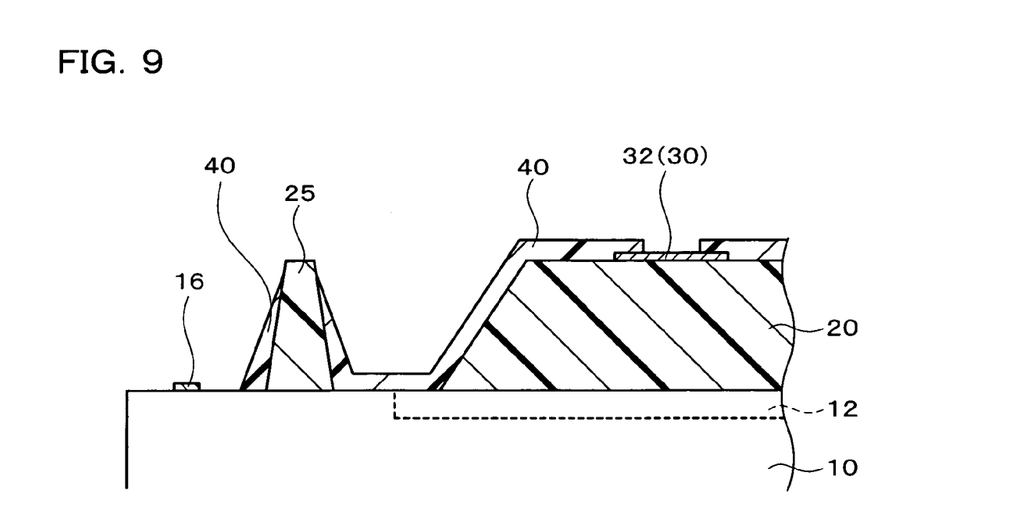
FIG. 9 is further illustrative of the modification of the semiconductor device shown in FIG. 8.

In an example shown in FIGS. 8 and 9, the resin layer 40 is formed to expose at least an upper end portion of at least one of the second resin sections 25. In this embodiment of the present invention, the resin layer 40 (solder resist) is formed to extend further outward than the second resin sections 25. For that reason, contraction stresses of the resin layer 40 can be absorbed by the second resin sections 25, even if the resin layer 40 has been formed to expose upper end portions of the second resin sections 25, making it possible to achieve effects similar to those of the above-described embodiments. Note that FIG. 9 is a partial enlarged view of a section taken along the line IX—IX of FIG. 8.

Figure 10:
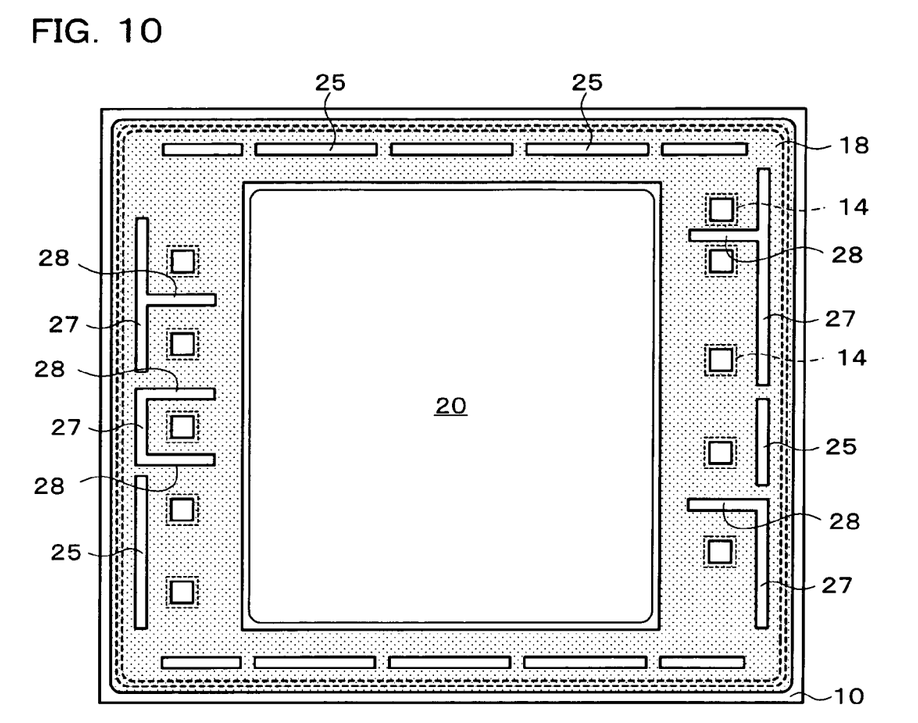
FIG. 10 is illustrative of a yet further modification of the semiconductor device in accordance with an embodiment of the present invention.

In an example shown in FIG. 10, the semiconductor device has second resin sections 27. The second resin sections 27 have divider portions 28 that extend between the electrodes 14 from a region on the outer side of the electrodes 14 to a region on the inner side of the electrodes 14. In other words, the divider portions 28 are formed between the electrodes 14. Since the divider portions 28 of this modification play the role of barriers, it is possible to prevent electromigration between the electrodes 14, making it possible to provide an even more reliable semiconductor device. Note that the second resin sections 27 could be formed in such a manner that the divider portions 28 are disposed between all of the electrodes 14. Alternatively, the second resin sections 27 could be formed selectively so that the divider portions 28 are disposed only between specific electrodes 14. If the second resin sections 27 are formed selectively, the second resin sections 27 could be formed in such a manner that the divider portions 28 are disposed on either side of each electrode 14 to which a high voltage is applied, by way of example. Alternatively, the second resin sections 27 could be formed in such a manner that one of the divider portions 28 is disposed between two electrodes that are disposed close together. In this modification, the resin layer (solder resist) could be formed to cover the second resin sections 27 as well (although this is not shown in the figure). Since this makes it difficult for moisture to intrude into the semiconductor device, it enables a further increase in the reliability of the semiconductor device.

The details of the configuration and manufacture of these modifications that are not described specifically above could be as described previously with reference to the embodiment of this invention. The configuration of the semiconductor device in accordance with the embodiment of the present invention could also be any combination of the above details.

The present invention is not limited to the above-described embodiment and thus various modifications thereto are possible. For example, the present invention comprises configurations that are substantially the same as those described with respect to this embodiment (such as configurations having the same function, method, and result or configurations having the same objective and effect). In addition, the present invention comprises configurations in which components are substituted that are not described with respect to this embodiment. The present invention further comprises configurations that achieve the same operating effect as the configuration described with reference to this embodiment, or configurations that achieve the same objective thereof. Furthermore, the present invention comprises configurations in which known techniques are added to the configuration described with reference to this embodiment.

What is claimed is:

1. A semiconductor device comprising:
   a semiconductor substrate in which is formed an integrated circuit, the semiconductor substrate having electrodes;
   a first resin section formed in a central portion of a surface of the semiconductor substrate on which the electrodes are formed;
   a plurality of second resin sections formed on the surface of the semiconductor substrate on which the electrodes are formed, in a region closer to an edge portion of the semiconductor substrate than the first resin section;
   an interconnect formed over the first resin section and one of the electrodes; and
   a resin layer formed to cover the interconnect and extend from the first resin section to outer sides of the second resin sections,
   the second resin sections being separate from the first resin section.

2. The semiconductor device as defined by claim 1, the second resin sections being formed along all edges of the semiconductor substrate.

3. The semiconductor device as defined by claim 1, the second resin sections being formed only along two opposite edges of the semiconductor substrate.

4. The semiconductor device as defined by claim 1, the second resin sections being formed in a region other than regions in which the electrodes are formed.

5. The semiconductor device as defined by claim 1, the resin layer being formed to cover the second resin sections.

6. The semiconductor device as defined by claim 1, the resin layer being formed to expose at least an upper end portion of at least one of the second resin sections.

7. The semiconductor device as defined by claim 1, at least one of the second resin sections having a divider portion which is disposed on the semiconductor substrate from a region on the outer sides of the electrodes towards a region on inner sides of the electrodes through a region between two of the electrodes adjacent to each other.

8. A circuit board on which the semiconductor device as defined in claim 1 is mounted.

9. An electronic instrument having the semiconductor device as defined in claim 1.

10. A method of manufacturing a semiconductor device comprising:
    providing a semiconductor substrate in which is formed an integrated circuit, the semiconductor substrate having electrodes;
    forming a first resin section in a central portion of a surface of the semiconductor substrate on which the electrodes are formed;
    forming a plurality of second resin sections on the surface of the semiconductor substrate on which the electrodes are formed, in a region closer to an edge portion of the semiconductor substrate than the first resin section;
    forming an interconnect over the first resin section and one of the electrodes; and
    forming a resin layer to cover the interconnect and extend from the first resin section to outer sides of the second resin sections,
    the second resin sections being formed separately from the first resin section.

11. The method of manufacturing a semiconductor device as defined by claim 10, the second resin sections being formed along all edges of the semiconductor substrate.

12. The method of manufacturing a semiconductor device as defined by claim 10, the second resin sections being formed only along two opposite edges of the semiconductor substrate.

13. The method of manufacturing a semiconductor device as defined by claim 10, the second resin sections being formed in a region other than regions in which the electrodes are formed.

14. The method of manufacturing a semiconductor device as defined by claim 10, the first resin section and the second resin sections being formed at the same time.

15. The method of manufacturing a semiconductor device as defined by claim 10, the resin layer being formed to cover the second resin sections.

16. The method of manufacturing a semiconductor device as defined by claim 10, the resin layer being formed to expose at least an upper end portion of at least one of the second resin sections.

17. The method of manufacturing a semiconductor device as defined by claim 10, at least one of the second resin sections having a divider portion which is disposed on the semiconductor substrate from a region on the outer sides of the electrodes towards a region on inner sides of the electrodes through a region between two of the electrodes adjacent to each other.

18. A semiconductor device comprising:
- a semiconductor substrate in which is formed an integrated circuit, the semiconductor substrate having electrodes;
- a first resin section formed in a central portion of a surface of the semiconductor substrate on which the electrodes are formed;
- a plurality of second resin sections formed on the surface of the semiconductor substrate on which the electrodes are formed, in a region closer to an edge portion of the semiconductor substrate than the first resin section;
- an interconnect formed over the first resin section and one of the electrodes; and
- a resin layer formed to cover the interconnect and extend from the first resin section to outer sides of the second resin sections,
- the second resin sections being formed only along two opposite edges of the semiconductor substrate.

19. A semiconductor device comprising:
- a semiconductor substrate in which is formed an integrated circuit, the semiconductor substrate having electrodes;
- a first resin section formed in a central portion of a surface of the semiconductor substrate on which the electrodes are formed;
- a plurality of second resin sections formed on the surface of the semiconductor substrate on which the electrodes are formed, in a region closer to an edge portion of the semiconductor substrate than the first resin section;
- an interconnect formed over the first resin section and one of the electrodes; and
- a resin layer formed to cover the interconnect and extend from the first resin section to outer sides of the second resin sections,
- the resin layer being formed to expose at least an upper end portion of at least one of the second resin sections.

20. A semiconductor device comprising:
- a semiconductor substrate in which is formed an integrated circuit, the semiconductor substrate having electrodes;
- a first resin section formed in a central portion of a surface of the semiconductor substrate on which the electrodes are formed;
- a plurality of second resin sections formed on the surface of the semiconductor substrate on which the electrodes are formed, in a region closer to an edge portion of the semiconductor substrate than the first resin section;
- an interconnect formed over the first resin section and one of the electrodes; and
- a resin layer formed to cover the interconnect and extend from the first resin section to outer sides of the second resin sections,
- at least one of the second resin sections having a divider portion which is disposed on the semiconductor substrate from a region on the outer sides of the electrodes towards a region on inner sides of the electrodes through a region between two of the electrodes adjacent to each other.

* * * * *